US009142478B2

(12) United States Patent  (10) Patent No.: US 9,142,478 B2
Kim et al.  (45) Date of Patent: Sep. 22, 2015

(54) SEMICONDUCTOR PACKAGE STACK HAVING A HEAT SLUG

(71) Applicants: Yong-Hoon Kim, Suwon-si (KR); Ji-Chul Kim, Yongin-si (KR); Seong-Ho Shin, Hwaseong-si (KR); In-Ho Choi, Seoul (KR)

(72) Inventors: Yong-Hoon Kim, Suwon-si (KR); Ji-Chul Kim, Yongin-si (KR); Seong-Ho Shin, Hwaseong-si (KR); In-Ho Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/102,430

(22) Filed: Dec. 10, 2013

(65) Prior Publication Data

US 2014/0339692 A1  Nov. 20, 2014

(30) Foreign Application Priority Data

May 20, 2013 (KR) .................. 10-2013-0056591

(51) Int. Cl.
*H01L 23/367* (2006.01)
*H01L 23/36* (2006.01)
(Continued)

(52) U.S. Cl.
CPC ............ *H01L 23/36* (2013.01); *H01L 23/3677* (2013.01); *H01L 23/373* (2013.01); *H01L 23/3736* (2013.01); *H01L 23/49816* (2013.01); *H01L 25/105* (2013.01); *H01L 2224/13025* (2013.01); *H01L 2224/14181* (2013.01); *H01L 2224/16145* (2013.01); *H01L 2224/16225* (2013.01); *H01L 2224/16245* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/73203* (2013.01); *H01L 2224/73204* (2013.01); *H01L 2224/73253* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01);
(Continued)

(58) Field of Classification Search
CPC ........... H01L 2225/06527; H01L 2225/06537; H01L 2225/06544; H01L 2225/06548; H01L 2225/06572; H01L 23/36; H01L 23/3677; H01L 23/373; H01L 25/105; H01L 23/49816; H01L 23/3736; H01L 23/481
USPC ......... 257/713, 712, 686, 723, 777, 774, 773, 257/675, 737, 738, 778, E23.08, 717, 721, 257/707, 720, E23.011, 698, 621, 706, 678
See application file for complete search history.

(56) References Cited

U.S. PATENT DOCUMENTS 5,200,631 A * 4/1993 Austin et al. .................. 257/570
5,481,136 A * 1/1996 Kohmoto et al. ............. 257/712
(Continued)

FOREIGN PATENT DOCUMENTS

KR  100216893 B1  9/1999

*Primary Examiner* — Alexander Oscar Williams
(74) *Attorney, Agent, or Firm* — Renaissance IP Law Group LLP

(57) ABSTRACT

A semiconductor package stack may include a lower semiconductor package and an upper semiconductor package stacked on a lower package board. The upper semiconductor package may include an upper semiconductor chip mounted on an upper package board with an opening configured to expose a lower surface of the upper semiconductor chip and a first heat slug disposed within the opening, contacting the lower surface of the upper semiconductor chip, and contacting an upper surface of a lower semiconductor chip.

20 Claims, 8 Drawing Sheets

(51) Int. Cl.
  *H01L 23/373* (2006.01)
  *H01L 23/498* (2006.01)
  *H01L 25/10* (2006.01)

(52) U.S. Cl.
  CPC ............ *H01L 2225/06565* (2013.01); *H01L 2225/06568* (2013.01); *H01L 2225/06589* (2013.01); *H01L 2225/1023* (2013.01); *H01L 2225/1058* (2013.01); *H01L 2225/1094* (2013.01); *H01L 2924/15151* (2013.01); *H01L 2924/15311* (2013.01); *H01L 2924/15331* (2013.01)

(56) References Cited

U.S. PATENT DOCUMENTS

| | | | |
|---|---|---|---|
| 6,060,777 A * | 5/2000 | Jamieson et al. | 257/707 |
| 6,756,684 B2 * | 6/2004 | Huang | 257/778 |
| 7,196,411 B2 * | 3/2007 | Chang | 257/706 |
| 8,188,593 B2 * | 5/2012 | Chen et al. | 257/712 |
| 8,299,595 B2 | 10/2012 | Yoon et al. | |
| 2005/0133906 A1 * | 6/2005 | Woodall et al. | 257/707 |
| 2005/0230800 A1 * | 10/2005 | Do et al. | 257/686 |
| 2006/0043581 A1 * | 3/2006 | Prokofiev | 257/713 |
| 2006/0220207 A1 * | 10/2006 | Akahoshi | 257/686 |
| 2009/0040727 A1 * | 2/2009 | Decker | 361/705 |
| 2009/0230544 A1 * | 9/2009 | Wang et al. | 257/712 |
| 2009/0294947 A1 * | 12/2009 | Tain et al. | 257/686 |
| 2010/0315787 A1 * | 12/2010 | Li et al. | 361/709 |
| 2011/0176280 A1 * | 7/2011 | Lee | 361/721 |
| 2011/0304035 A1 | 12/2011 | Kim et al. | |
| 2012/0007229 A1 * | 1/2012 | Bartley et al. | 257/712 |
| 2013/0093073 A1 * | 4/2013 | Chen et al. | 257/686 |
| 2013/0249074 A1 * | 9/2013 | Lee | 257/713 |
| 2013/0256850 A1 * | 10/2013 | Danny et al. | 257/664 |
| 2014/0284040 A1 * | 9/2014 | Colgan et al. | 165/185 |
| 2014/0327129 A1 * | 11/2014 | Cho et al. | 257/713 |
| 2014/0339692 A1 * | 11/2014 | Kim et al. | 257/713 |

* cited by examiner

SEMICONDUCTOR PACKAGE STACK HAVING A HEAT SLUG

CROSS-REFERENCE TO RELATED APPLICATION

This application claims priority under 35 U.S.C. §119 to Korean Patent Application No. 10-2013-0056591 filed on May 20, 2013, the disclosure of which is hereby incorporated by reference in its entirety.

BACKGROUND

Embodiments relate to a semiconductor package stack having a heat slug.

System-on-chip (SoC) is a technology-intensive semiconductor field in which complex systems having various functions are implemented in a single chip. As computers, telecommunications, broadcasting, etc. gradually converge, demand for an application specific IC (ASIC) and an application specific standard Product (ASSP) converted into an SoC increases. In addition, a trend for light, thin, short, small, and high-performance IT products becomes a factor in accelerating SoC development. However, a SoC-type semiconductor chip may generate high heat during operation that may result in damage.

SUMMARY

An embodiment includes a semiconductor package stack, comprising: a lower semiconductor package including a lower semiconductor chip mounted on a lower package board; an upper semiconductor package stacked on the lower semiconductor package and including an upper semiconductor chip mounted on an upper package board, wherein the upper package board includes an opening configured to expose a lower surface of the upper semiconductor chip; and a first heat slug disposed within the opening, contacting the lower surface of the upper semiconductor chip, and contacting an upper surface of the lower semiconductor chip.

An embodiment includes a semiconductor package stack, comprising: a lower semiconductor package including a lower semiconductor chip mounted on a lower package board, and a lower molding layer configured to cover an upper surface of the lower package board, substantially surround side surfaces of the lower semiconductor chip, and expose an upper surface of the lower semiconductor chip; an upper semiconductor package including an upper semiconductor chip mounted on an upper package board, wherein the upper package board includes an opening exposing a lower surface of the upper semiconductor chip; a connecting bump disposed between the upper surface of the lower package board and a lower surface of the upper package board, wherein side surfaces of the connecting bump are substantially surrounded by the lower molding layer; and a first heat slug arranged on the upper surface of the lower semiconductor chip, extending through the opening, and contacting the exposed lower surface of the upper semiconductor chip.

An embodiment includes a semiconductor package stack, comprising: an upper semiconductor chip; a lower semiconductor chip; a package board including an opening; a heat slug extending through the opening, substantially directly contacting a lower surface of the upper semiconductor chip, and substantially directly contacting an upper surface of the lower semiconductor chip.

DETAILED DESCRIPTION OF THE EMBODIMENTS

Figure 1A:
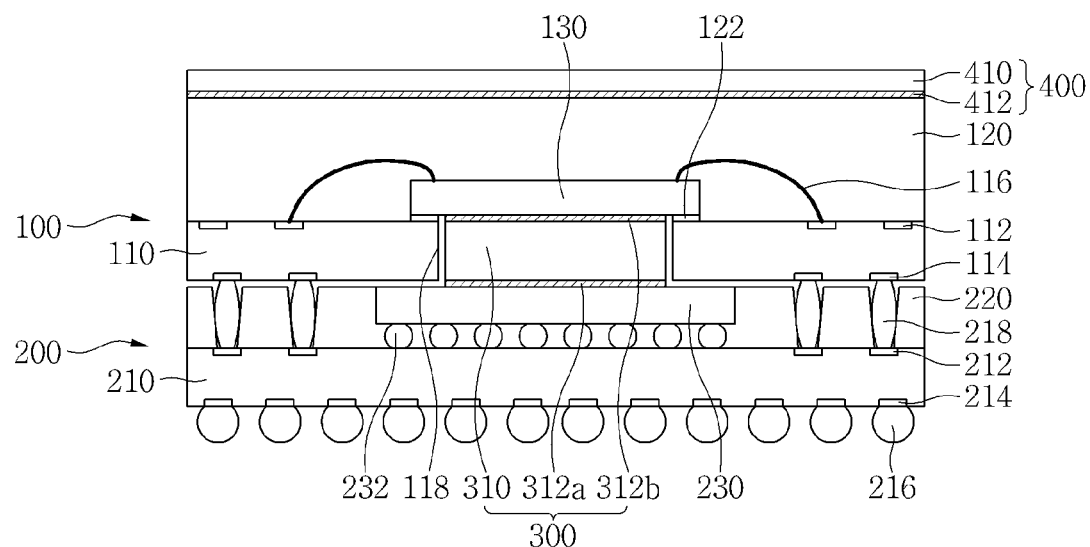
FIGS. 1A and 1B are views showing semiconductor package stacks in accordance with embodiments.

Various embodiments will now be described more fully with reference to the accompanying drawings in which some embodiments are shown. Embodiments may take other forms and should not be construed as limited to the embodiments set forth herein. Rather, these embodiments are provided so that this disclosure is thorough and complete and fully conveys the concepts to those skilled in the art.

The foregoing and other features and advantages will be apparent from the more particular description of embodiments, as illustrated in the accompanying drawings in which like reference characters refer to the same parts throughout the different views. The drawings are not necessarily to scale, emphasis instead being placed upon illustrating the principles. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of an embodiment, such elements should not be construed as limited by these terms. For example, a first element could be termed a second element, and a second element could be termed a first element. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein to describe embodiments is not intended to be limiting. The articles "a," "an," and "the"

are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to be.

Unless otherwise defined, all terms (including technical and scientific terms) used herein are to be interpreted as is customary in the relevant art. It will be further understood that terms in common usage should also be interpreted as is customary in the relevant art and not in an idealized or overly formal sense unless expressly so defined herein.

Figure 1B:
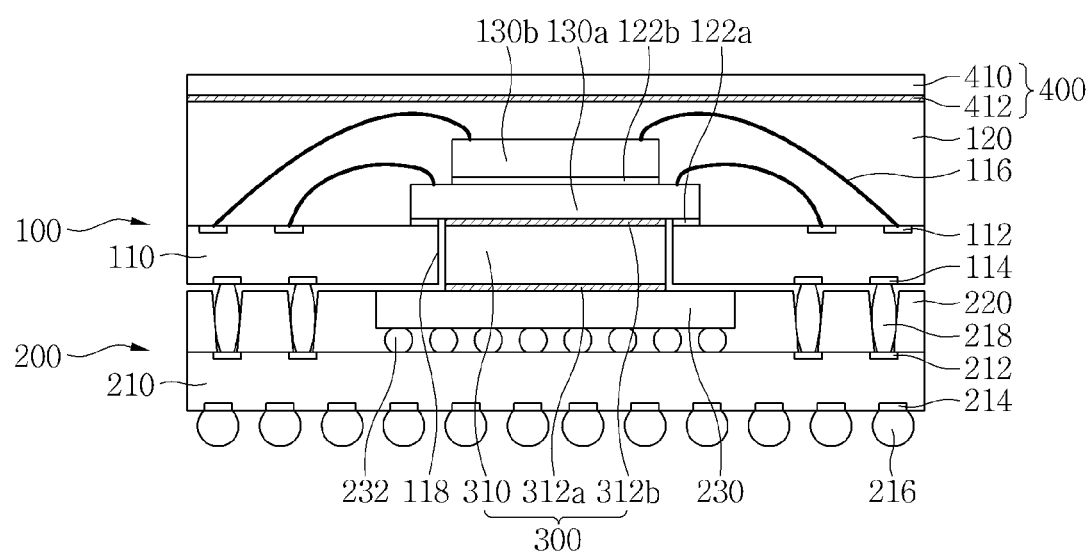

FIGS. 1A and 1B are cross-sectional views showing semiconductor package stacks in accordance with embodiments. Referring to FIG. 1A, a semiconductor package stack 1000a in accordance with an embodiment may include an upper semiconductor package 100, a lower semiconductor package 200, connecting bumps 218, and a first heat slug 300.

The upper semiconductor package 100 may include an upper package board 110, an upper semiconductor chip 130, a bonding wire 116, and an upper molding layer 120.

The upper package board 110 may include a printed circuit board (PCB), or other suitable substrate for semiconductor chips. The upper package board 110 may include a first upper board pad 112, a second upper board pad 114, and an opening 118 passing through the upper package board 110. The first upper board pad 112 may be arranged on an upper surface of the upper package board 110. The second upper board pad 114 may be arranged on a lower surface of the upper package board 110. The opening 118 may expose a lower surface of the upper semiconductor chip 130.

The upper semiconductor chip 130 may be mounted on the upper package board 110. The upper semiconductor chip 130 may be fixed on the upper package board 110 using an adhesive layer 122. The adhesive layer 122 may include a die attach film (DAF) or other adhesives used to attach semiconductor chips. The opening 118 may expose the lower surface of the upper semiconductor chip 130. The upper semiconductor chip 130 may include a memory semiconductor device or other types of semiconductor devices.

The bonding wire 116 may electrically connect the upper semiconductor chip 130 and the first upper board pad 112. The bonding wire 116 may include gold (Au), aluminum (Al), or other suitable bonding material.

The upper molding layer 120 may cover upper surfaces of the upper semiconductor chip 130, the bonding wire 116, and the upper package board 110. The upper molding layer 120 may protect the upper semiconductor chip 130 and the bonding wire 116, both physically and chemically. The upper molding layer 120 may include an epoxy resin such as an epoxy molding compound (EMC), a curing agent, an organic/inorganic filler, or other similar materials or combinations of materials.

The lower semiconductor package 200 may include a lower package board 210, a lower semiconductor chip 230, a lower chip bump 232, and a lower molding layer 220.

The lower package board 210 may include a PCB or other substrate suitable for mounting a semiconductor chip. The lower package board 210 may include a first lower board pad 212 and a second lower board pad 214. The first lower board pad 212 may be arranged on an upper surface of the lower package board 210. The second lower board pad 214 may be arranged on a lower surface of the lower package board 210.

The lower semiconductor chip 230 may be mounted on the lower package board 210. The lower semiconductor chip 230 may be mounted in a flip-chip type in which an active surface faces down, as shown in FIG. 1A. The lower semiconductor chip 230 may include a logic semiconductor device or other types of semiconductor devices.

The lower chip bump 232 may be arranged between the lower package board 210 and the lower semiconductor chip 230. The lower chip bump 232 may electrically connect the lower semiconductor chip 230 and the lower package board 210. The lower chip bump 232 may include a solder ball or other interconnection structure.

The lower molding layer 220 may substantially surround the lower semiconductor chip 230, the lower chip bump 232, and the lower package board 210. An upper surface of the lower semiconductor chip 230 may be exposed without being covered by the lower molding layer 220. Although the entire upper surface of the lower semiconductor chip 230 is illustrated as being exposed, in other embodiments, less than all of the upper surface of the lower semiconductor chip 230 may be exposed by the lower molding layer 220. The upper surface of the lower semiconductor chip 230 and an upper surface of the lower molding layer 220 may be substantially co-planar. The lower molding layer 220 may include an epoxy resin such as an EMC, a curing agent, an organic/inorganic filler, or other similar materials or combinations of materials.

The connecting bumps 218 may be arranged between the first lower board pads 212 of the lower package board 210 and the second upper board pads 114 of the upper package board 110 in such a way that the connecting bumps 218 pass through the lower molding layer 220 and electrically connect the first lower board pads 212 of the lower package board 210 and the second upper board pads 114 of the upper package board 110. The connecting bump 218 may include a conductive material such as a metal, a solder, or other interconnection materials.

The semiconductor package stack 1000a may further include solder balls 216 arranged on the second lower board pad 214. The semiconductor package stack 1000a may be configured to be electrically connected to an external module board, a system board, a motherboard, a main board, or other board or substrate through the solder balls 216.

The first heat slug 300 may include a first heat spreading plate 310 and first heat transmitting materials (e.g., thermal interface materials (TIM)) 312a and 312b. The first heat slug 300 may be arranged between the upper semiconductor package 100 and the lower semiconductor package 200, for example, between the upper semiconductor chip 130 and the lower semiconductor chip 230. In this embodiment, the first heat slug 300 may be arranged in the opening 118 formed in the upper package board 110 to be substantially in contact with the upper surface of the lower semiconductor chip 230 and the lower surface of the upper semiconductor chip 130 by passing through the opening 118. Since the first heat slug 300 is substantially in direct contact with the lower semiconductor chip 230 and the upper semiconductor chip 130, heat may be spread and dissipated more effectively and faster. Although the first heat spreading plate 310 may be in direct contact with the lower semiconductor chip 230 and the upper semiconductor chip 130, as described above, TIMs may be present to aid in creating a thermal connection and thus, the heat slug 300 may be substantially in direct contact with the lower semiconductor chip 230 and the upper semiconductor chip 130.

The first heat spreading plate 310 may include a material having higher thermal conductivity, graphene, carbon nanotube (CNT), metallic materials, or other material having a higher thermal conductivity. For example, the first heat spreading plate 310 may include at least one of copper (Cu), aluminum (Al), iron (Fe), nickel (Ni), cobalt (Co), tungsten (W), chromium (Cr), magnesium (Mg), silicon (Si), gold (Au), silver (Ag), platinum (Pt), zinc (Zn), tin (Sn), stainless steel, and alloys of such materials.

The first heat transmitting materials 312a and 312b may include a first lower heat transmitting material 312a and a first upper heat transmitting material 312b. The first lower heat transmitting material 312a may be interposed between a lower surface of the first heat spreading plate 310 and the upper surface of the lower semiconductor chip 230. The first upper heat transmitting material 312b may be interposed between an upper surface of the first heat spreading plate 310 and the lower surface of the upper semiconductor chip 130. The first heat transmitting materials 312a and 312b may have an adhesive property. The first heat transmitting materials 312a and 312b before curing or hardening may have viscosity. Accordingly, contact areas between the lower semiconductor chip 230 and the first heat spreading plate 310, and between the first heat spreading plate 310 and the upper semiconductor chip 130 may become wider, and heat transfer efficiency may be improved. The first heat transmitting materials 312a and 312b may include monomers or polymers which have thermally conductive particles, or other materials with higher thermal conductivity.

The semiconductor package stack 1000a may further include a second heat slug 400 disposed on the upper semiconductor package 100. The second heat slug 400 may include a second heat spreading plate 410 and a second heat transmitting material 412. The second heat slug 400 may substantially if not fully cover an upper surface of the upper semiconductor package 100. The second heat spreading plate 410 may include the same types of material as the first heat spreading plate 310; however, in an embodiment, the materials used for the first heat spreading plate 310 and the second heat spreading plate 410 may or may not be different materials. The second heat transmitting material 412 may be in contact with an upper surface of the upper molding layer 120 of the upper semiconductor package 100. The second heat transmitting material 412 may be interposed between the upper semiconductor package 100 and the second heat spreading plate 410. For example, the second heat spreading plate 410 may be fixed on the upper molding layer 120 using the second heat transmitting material 412. The second heat transmitting material 412 may include the same types of material as the first heat transmitting materials 312a and 312b however, in an embodiment, the materials used for the first heat transmitting materials 312a and 312b and the second heat transmitting material 412 may or may not be different materials.

Referring to FIG. 1B, a semiconductor package stack 1000b in accordance with an embodiment may include an upper semiconductor package 100, a lower semiconductor package 200, a connecting bump 218, a first heat slug 300, and/or a second heat slug 400. Some elements may be similar to those described above, the description of which will be omitted for clarity. The upper semiconductor package 100 may include at least two stacked chips, for example, the upper semiconductor package 100 may include a first upper semiconductor chip 130a and a second upper semiconductor chip 130b disposed on the first upper semiconductor chip 130a. For example, the first upper semiconductor chip 130a may be fixed on an upper package board 110 using a first adhesive layer 122a. The second upper semiconductor chip 130b may be fixed on the first upper semiconductor chip 130a using a second adhesive layer 122b. The first adhesive layer 122a and the second adhesive layer 122b may include a DAF, or other adhesive material. In this embodiment, an opening 118 may expose a lower surface of the first upper semiconductor chip 130a.

In the semiconductor package stacks 1000a and 1000b in accordance with embodiments, heat generated from the lower semiconductor chip 230 may be transferred to the upper semiconductor chips 130 or 130a and 130b by the first heat slug 300 and dissipated to the atmosphere. The heat transferred to the upper semiconductor chips 130 or 130a and 130b may be more effectively dissipated by the second heat slug 400. Generally, heat may be generated more in a logic semiconductor device than in a memory semiconductor device. In addition, since the heat generated from the logic semiconductor device is not uniform throughout the semiconductor device and concentrated in a specific area, the reliability of the logic semiconductor device may rapidly decrease. In an embodiment, since heat generated from a semiconductor package including the logic semiconductor device may be effectively spread and dissipated through a semiconductor package including a memory semiconductor device, the reliability of the logic semiconductor device may be improved.

Figure 2A:
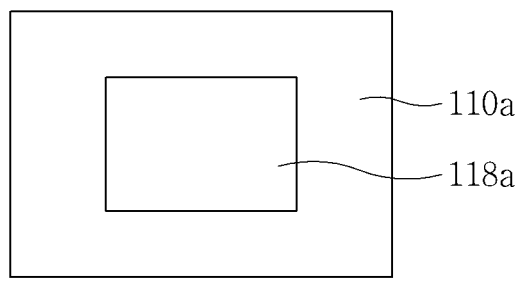
FIGS. 2A to 2D are plan views showing openings formed on package boards of semiconductor package stacks in accordance with various embodiments.
Figure 2B:
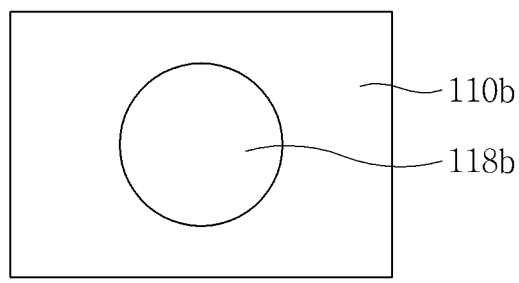
Figure 2C:
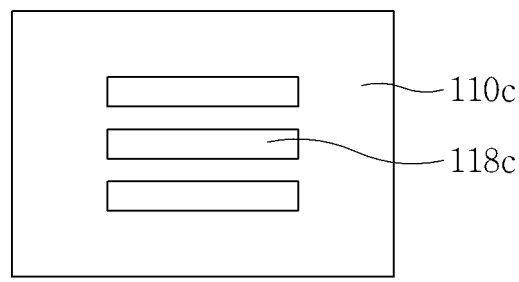
Figure 2D:
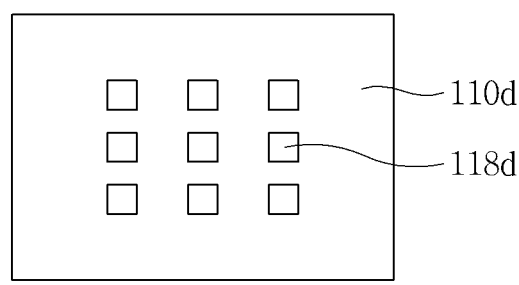

FIGS. 2A to 2D are top views showing openings in accordance with various embodiments. Referring to FIGS. 2A to 2D, openings 118a, 118b, 118c, and 118d in accordance with various embodiments may have a polygonal shaped, a circular shaped, a plurality of bar shaped, and/or a plurality of island shaped arrangement. In FIGS. 2A, 2C, and 2D, the openings 118a, 118c, and 118d are described as being a tetragonal shape. The openings 118a, 118b, 118c, and 118d may be included in the corresponding upper package board 110a, 110b, 110c, and 110d, respectively. For example, the openings 118a, 118b, 118c, and 118d may pass through the upper package board 110a, 110b, 110c, and 110d, respectively. In an embodiment, where multiple openings are used, such as in FIGS. 2C and 3D, the openings may substantially correspond to portions of the lower semiconductor chip 230. For example, the openings 118d of FIG. 2D may correspond to local hot spots of the lower semiconductor chip 230. Moreover, although multiple openings in FIGS. 2C and 2D are illustrated as being disposed in a regular pattern, the openings may be disposed in irregular patterns.

Figure 3A:
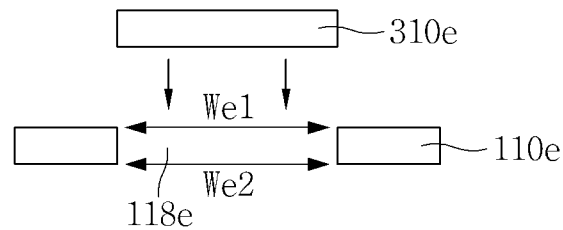
FIGS. 3A to 3C are cross-sectional views showing heat slugs and respectively corresponding package boards in semiconductor package stacks in accordance various with embodiments.
Figure 3B:
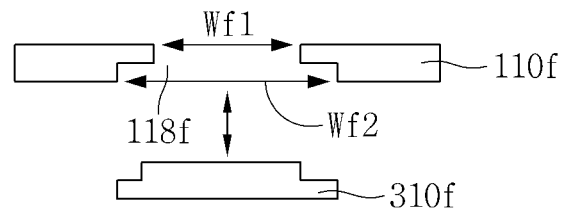
Figure 3C:
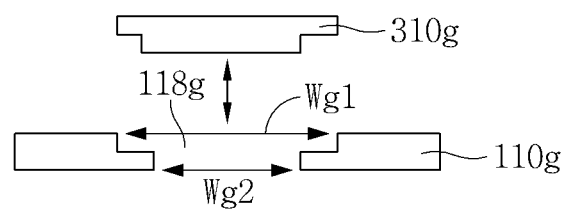

FIGS. 3A to 3C are side cross-sectional views showing various configurations of upper package boards and first heat spreading plates in accordance with various embodiments. Referring to FIG. 3A, according to an embodiment, an upper package board 110e may include an opening 118e having the same upper width We1 and lower width We2, and a first heat spreading plate 310e may include upper and lower surfaces having substantially the same area.

Referring to FIG. 3B, according to an embodiment, an upper package board 110f may include an opening 118f having an upper width Wf1 smaller than a lower width Wf2, and a first heat spreading plate 310f may include an upper part having a smaller width than a lower part.

Referring to FIG. 3C, according to an embodiment, an upper package board 110g may include an opening 118g having an upper width Wg1 larger than a lower width Wg2, and a first heat spreading plate 310g may include an upper part having a larger width than a lower part.

Referring again to FIGS. 3B and 3C, the openings 118f and 118g of the upper package boards 110f and 110g and/or the first heat spreading plates 310e, 310f, and 310g may have stepped sidewalls. In addition, the openings 118f and 118g of the upper package boards 110f and 110g and/or the first heat spreading plates 310e, 310f, and 310g may have tapered sidewalls. Although a stepped sidewall and/or a tapered sidewall have been described above with respect to cross-sectional views, the openings 118f and 118g of the upper package boards 110f and 110g and/or the first heat spreading plates 310e, 310f, and 310g may have such structures on all or less than all of the edge of the corresponding structure. For example, the stepped sidewall of the opening 118f and the first heat spreading plate 310f may only extend on two sides of a multi-sided polygon.

Figure 4:
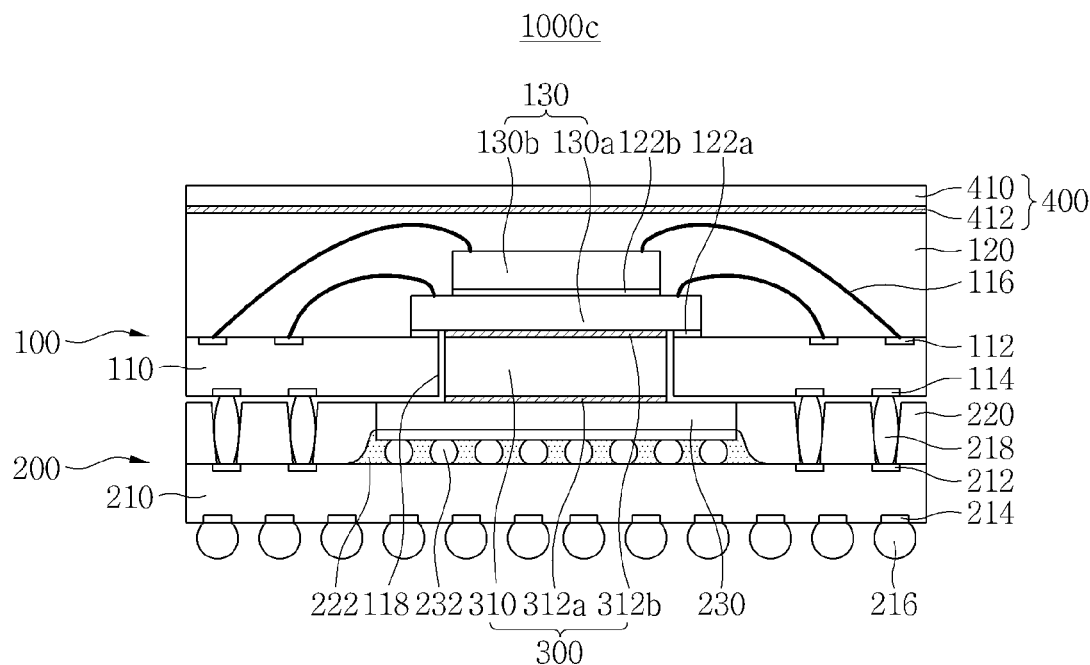
FIGS. 4 to 7 are cross-sectional views showing semiconductor package stacks in accordance with other embodiments.

FIGS. 4 to 7 are cross-sectional views showing semiconductor package stacks in accordance with other embodiments. Referring to FIG. 4, a semiconductor package stack 1000c in accordance with an embodiment may include an upper semiconductor package 100, a lower semiconductor package 200, connecting bumps 218, a first heat slug 300, and/or second heat slug 400. The lower semiconductor package 200 may include a lower package board 210, a lower semiconductor chip 230 mounted on the lower package board 210 using a flip-chip bonding method, a lower chip bumps 232 and underfill 222 disposed between the lower package board 210 and the lower semiconductor chip 230, and a lower molding layer 220 substantially surrounding the lower semiconductor chip 230. The underfill 222 may substantially surround the lower chip bumps 232. The underfill 222 may include a silica filler or other filler material. Elements which are not described herein may be understood with reference to FIGS. 1A to 3C.

Figure 5:
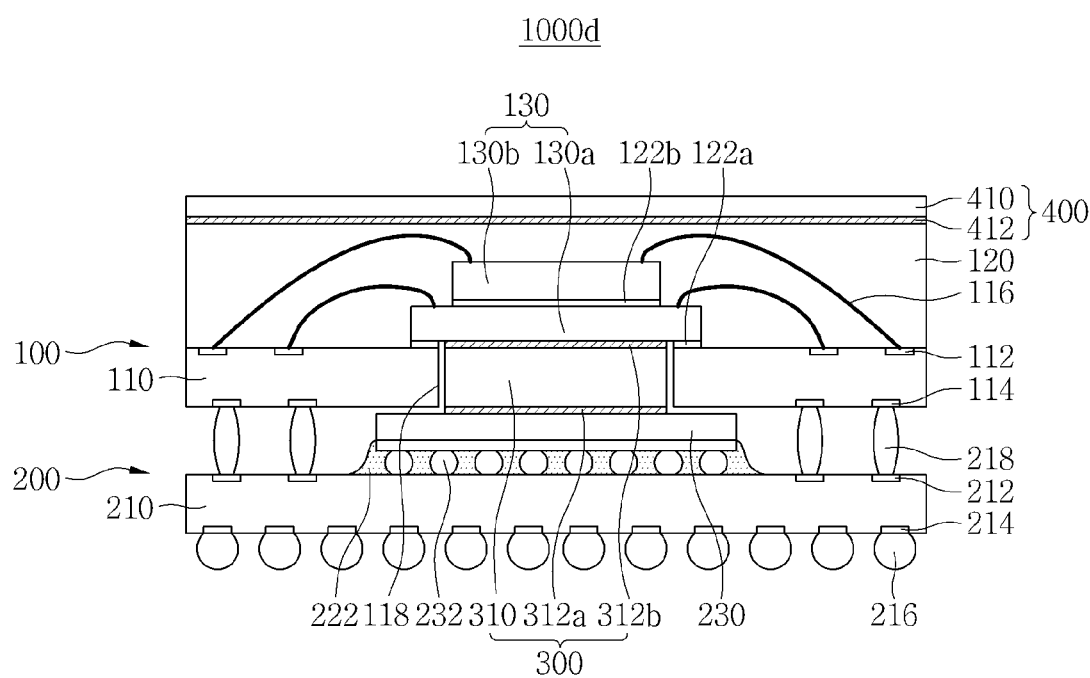

Referring to FIG. 5, a semiconductor package stack 1000d in accordance with an embodiment may include an upper semiconductor package 100, a lower semiconductor package 200, connecting bumps 218, a first heat slug 300, and/or a second heat slug 400. The lower semiconductor package 200 may include a lower package board 210, a lower semiconductor chip 230, lower chip bumps 232, and an underfill 222 disposed between the lower package board 210 and the lower semiconductor chip 230. The semiconductor package stack 1000d in accordance with an embodiment may have elements similar to those of FIGS. 1A, 1B, and 4, may include the lower semiconductor package 200 in which a lower molding layer 220 is omitted.

Figure 6:
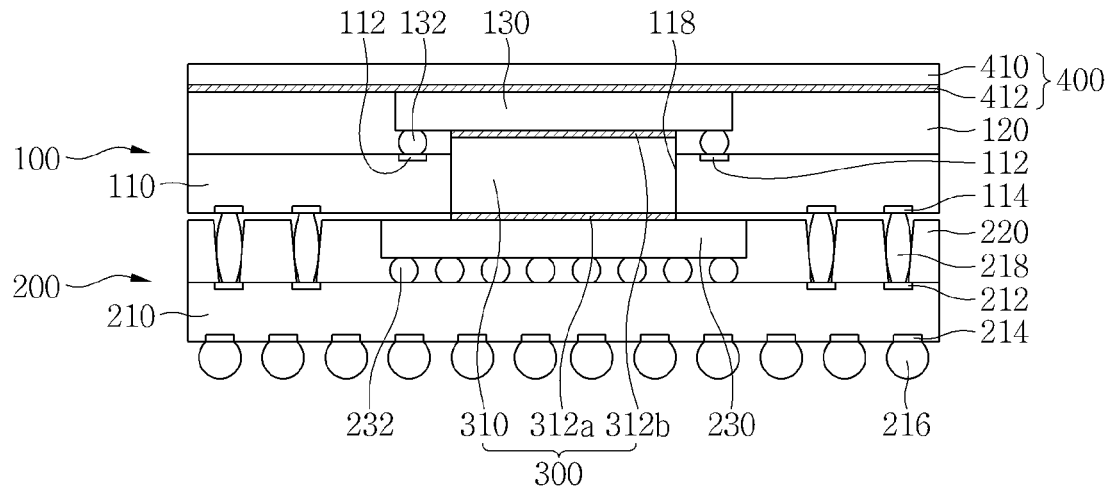

Referring to FIG. 6, a semiconductor package stack 1000e in accordance with an embodiment may include an upper semiconductor package 100, a lower semiconductor package 200, connecting bumps 218, a first heat slug 300, and/or a second heat slug 400. Some elements may be similar to those described above, the description of which will be omitted for clarity. The upper semiconductor package 100 may include an upper semiconductor chip 130 mounted on an upper package board 110 using a flip-chip method. Upper chip bumps 132 may be arranged between first upper board pads 112 of the upper package board 110 and the upper semiconductor chip 130. A lower surface of the upper semiconductor chip 130 may be substantially in contact with the first heat slug 300. An upper surface of the upper semiconductor chip 130 may be substantially in contact with the second heat slug 400.

Figure 7:
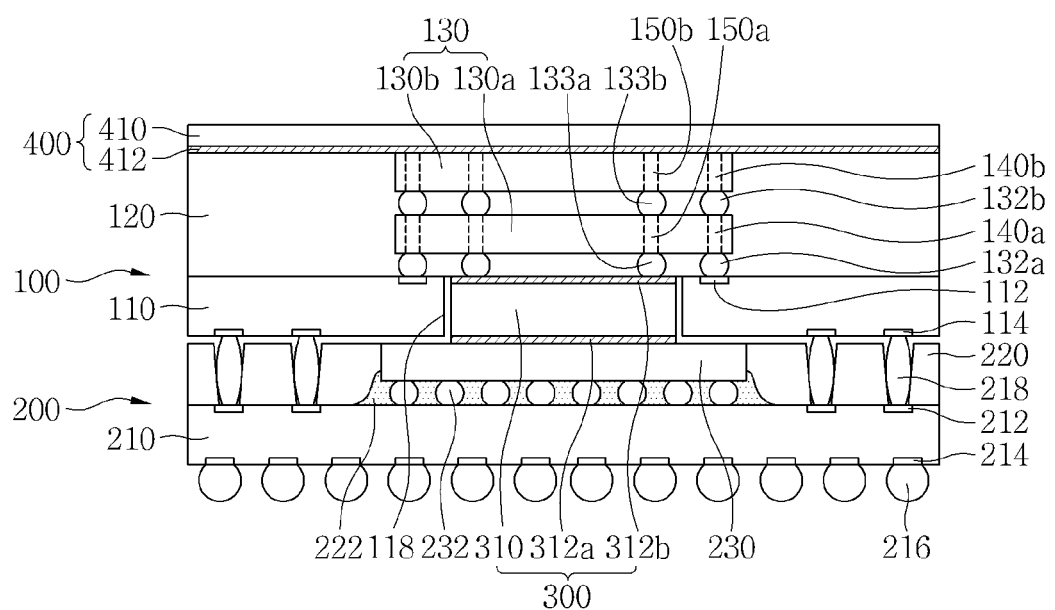

Referring to FIG. 7, a semiconductor package stack 1000f in accordance with an embodiment may include an upper semiconductor package 100, a lower semiconductor package 200, connecting bumps 218, a first heat slug 300, and/or a second heat slug 400. Some elements may be similar to those described above, the description of which will be omitted for clarity. The upper semiconductor package 100 may include multiple stacked upper semiconductor chips 130a and 130b mounted on the upper package board 110. The upper semiconductor chips 130a and 130b may include conductive through-silicon-vias (TSV) 140a, 140b, 150a, and 150b, and upper chip bumps 132a, 132b, 133a, and 133b. The TSV may include signal vias 140a and 140b passing through the upper semiconductor chips 130a and 130b and providing electrical connection, and thermal transfer vias 150a and 150b providing a heat dissipation path. The upper chip bumps 132a, 132b, 133a, and 133b may include signal bumps 132a and 132b connected to the signal vias 140a and 140b, and thermal transfer bumps 133a and 133b connected to the thermal transfer vias 150a and 150b. The upper chip bumps 132a, 132b, 133a, and 133b may include solder balls or other interconnection structure.

For example, the signal vias 140a and 140b may be electrically connected to corresponding first upper board pads 112 of the upper package board 110 through the signal bumps 132a and 132b, and the thermal transfer vias 150a and 150b may be physically connected to the first heat slug 300 through the thermal transfer bumps 133a and 133b. In the semiconductor package stack 1000f in accordance with embodiments, heat generated from the lower semiconductor chip 230 may be transferred to the second heat slug 400 through the first heat slug 300, the thermal transfer bumps 133a and 133b, and the thermal transfer vias 150a and 150b, and dissipated to the atmosphere. In this case, the first heat slug 300 may be substantially in direct contact with the thermal transfer bump 133a. Accordingly, heat dissipation performance may be further improved.

Figure 8A:
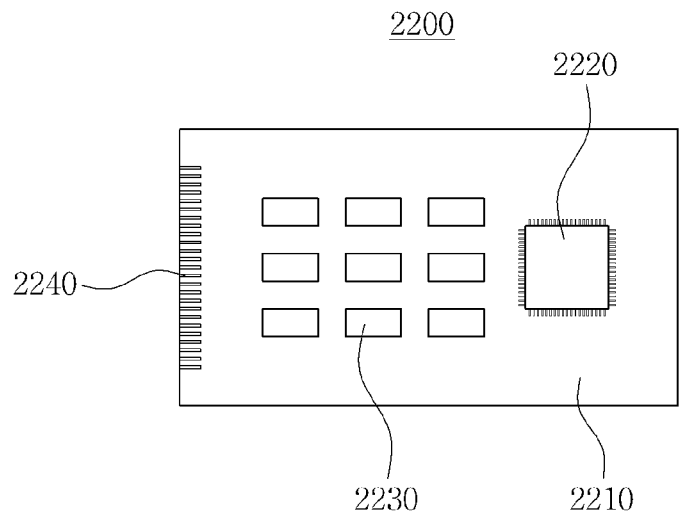
FIGS. 8A to 8C are block diagrams schematically showing a semiconductor module or electronic systems including at least one of semiconductor package stacks in accordance with various embodiments.

FIG. 8A is a diagram schematically showing a semiconductor module 2200 in accordance with an embodiment. Referring to FIG. 8A, a semiconductor module 2200 in accordance with an embodiment may include a processor 2220 and semiconductor chips 2230 which are mounted on a module substrate 2210. One or more of the processor 2220 and the semiconductor chips 2230 may include at least one of the semiconductor package stacks 1000a to 1000f in accordance with various embodiments. Input/output terminals 2240 may be arranged on at least one side of the module substrate 2210.

Figure 8B:
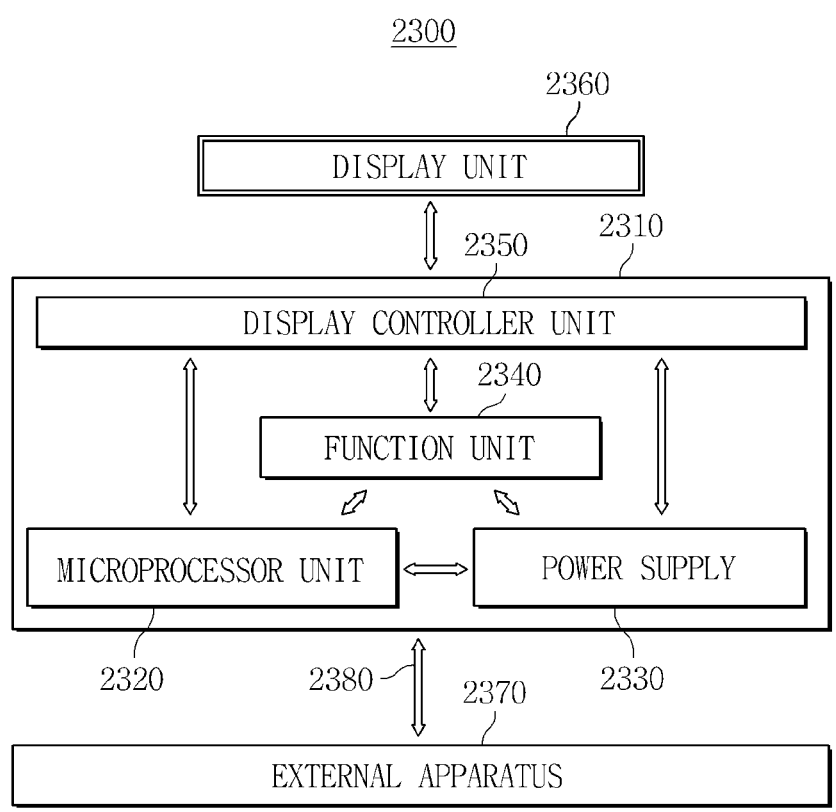
Figure 8C:
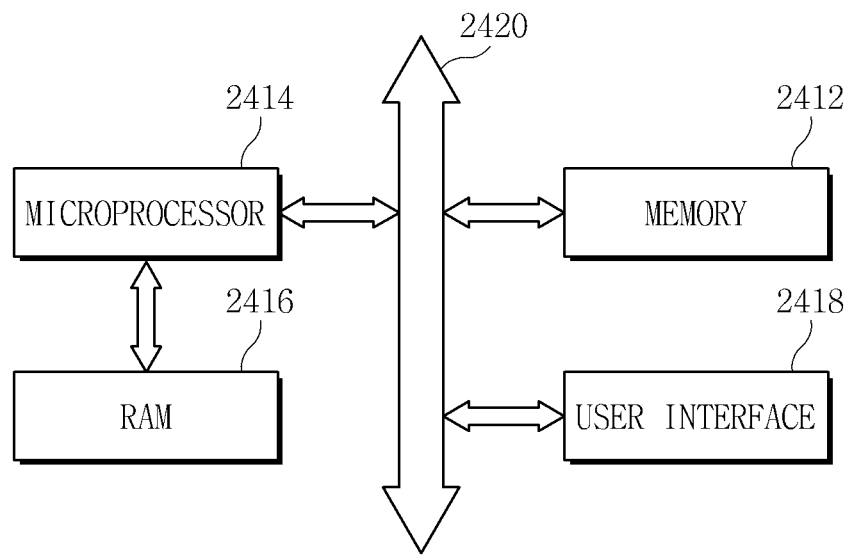

FIGS. 8B and 8C are system block diagrams schematically showing electronic systems in accordance with embodiments. Referring to FIG. 8B, an electronic system 2300 in accordance with an embodiment may include a body 2310, a display unit 2360, and an external apparatus 2370.

The body 2310 may include a microprocessor unit 2320, a power supply 2330, a function unit 2340, and/or a display controller unit 2350. The body 2310 may include a system board or motherboard having a printed circuit board (PCB), and/or a case. The microprocessor unit 2320, the power supply 2330, the function unit 2340, and the display controller unit 2350 may be installed or arranged on an upper surface or an inside of the body 2310. A display unit 2360 may be arranged inside or outside of the body 2310.

The display unit 2360 may be configured to display an image processed by the display controller unit 2350. For example, the display unit 2360 may include a liquid crystal display (LCD), an active matrix organic light emitting diodes (AMOLED), or a variety of display panel. The display unit 2360 may include a touch-screen. Accordingly, the display unit 2360 may have an input/output function.

The power supply 2330 may be configured to supply a current or voltage to the microprocessor unit 2320, the function unit 2340, the display controller unit 2350, or the like. The power supply 2330 may include a rechargeable battery, a socket for the battery, voltage/current converter, or the like.

The microprocessor unit 2320 may be configured to receive a voltage from the power supply 2330 to control the function unit 2340 and the display unit 2360. For example, the microprocessor unit 2320 may include a CPU, an application processor (AP), or the like.

The function unit 2340 may be configured to perform various functions. For example, the function unit 2340 may include a touch-pad, a touch-screen, a volatile/nonvolatile memory, a memory card controller, a camera, a light, an audio and video playback processor, a wireless transmit/receive antenna, a speaker, a microphone, a USB port, and other units having various functions.

The microprocessor unit 2320, the function unit 2340, or other semiconductor packages of the various elements of the electronic system 2300 may include semiconductor package stacks similar to at least one of the semiconductor package stacks 1000a to 1000f in accordance with various embodiments.

Referring to FIG. 8C, an electronic system 2400 may include a microprocessor 2414, a memory system 2412, and a user interface 2418 configured to perform data communication using a bus 2420. The microprocessor 2414 may include a CPU, an AP, or the like. The electronic system 2400 may further include a random access memory (RAM) 2416 configured to directly communicate with the microprocessor 2414. The microprocessor 2414 and the RAM 2416 may be assembled in a single package. The user interface 2418 may be used to input data to, or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or other various input/output devices. The memory system 2412 may be configured to store codes for operating the microprocessor 2414, data processed by the microprocessor 2414, external input data, or the like. The memory system 2412 may include a memory controller, a hard disk, a solid state drive (SSD), or other similar devices. The microprocessor unit 2414, the RAM 2416, the memory system, or other devices of the electronic system 2400 may include a semiconductor package stack similar to at least one of the semiconductor package stacks 1000a to 1000f in accordance with various embodiments.

As described above, a heat slug may contact the upper and lower semiconductor chips. In an embodiment, the heat slug may directly contact the upper and lower semiconductor chips. For example, the heat slug may include a heat spreading plate and thermal interface materials on opposite sides of the heat spreading plate. The thermal interface materials and the heat spreading plate may directly contact the upper and lower semiconductor chips. The thermal interface materials may be conformal materials selected to improve thermal contact between the heat spreading plate and the upper and lower semiconductor chips. In a particular embodiment, the thermal interface materials may fill gaps between the heat spreading plate and the upper and lower semiconductor chips. For example, the thermal interface materials may fill the gaps between the upper and lower semiconductor chips and the corresponding surfaces of the heat spreading plate to substantially exclude voids and/or other materials with lower thermal conductance.

Since a semiconductor package stack in accordance with embodiments includes a heat slug which is substantially in direct contact with upper and lower semiconductor chips, heat generated from the lower semiconductor chip may be dissipated more rapidly and effectively.

An embodiment includes a semiconductor package stack having a heat slug.

Other embodiments include a semiconductor module and electronic system having a stacked semiconductor package.

In an embodiment, a semiconductor package stack includes a lower semiconductor package, an upper semiconductor package stacked on the lower semiconductor package, and a heat slug disposed between the lower semiconductor package and the upper semiconductor package.

In an embodiment, a semiconductor package stack includes a lower semiconductor package, an upper semiconductor package stacked on the lower semiconductor package, a connecting bump disposed between the lower semiconductor package and the upper semiconductor package, and a heat slug disposed between the lower semiconductor package and the upper semiconductor package.

Although two semiconductor packages have been described as being stacked on one another, in other embodiments, more than two semiconductor packages may be stacked with intervening heat slugs present to conduct heat.

The foregoing is illustrative of embodiments and is not to be construed as limiting thereof. Although some embodiments have been described, those skilled in the art will readily appreciate that many modifications are possible without materially departing from the novel teachings and advantages. Accordingly, all such modifications are intended to be included as defined in the claims. In the claims, means-plus-function clauses are intended to cover the structures described herein as performing the recited function, and not only structural equivalents but also equivalent structures.

What is claimed is:

1. A semiconductor package stack, comprising:
   a lower semiconductor package including a lower semiconductor chip mounted on a lower package board;
   an upper semiconductor package stacked on the lower semiconductor package and including an upper semiconductor chip mounted on an upper package board, wherein the upper package board includes an opening configured to expose a lower surface of the upper semiconductor chip;
   a first heat slug disposed within the opening, contacting the lower surface of the upper semiconductor chip, and contacting an upper surface of the lower semiconductor chip; and
   a second heat slug disposed on the upper semiconductor package;
   wherein:
      the first heat slug comprises:
         a first heat spreading plate including a metal;
         a first lower thermal interface material between the first heat spreading plate and the upper surface of the lower semiconductor chip, the first lower thermal interface material being in direct contact with the upper surface of the lower semiconductor chip; and
         a first upper thermal interface material between the first heat spreading plate, the first upper thermal interface material being in direct contact with the lower surface of the upper semiconductor chip;

the upper semiconductor package is the uppermost semiconductor package of the semiconductor package stack;
the upper semiconductor package includes an upper molding layer configured to cover an upper surface of the upper package board and an upper surface of the upper semiconductor chip; and
the second heat slug is in contact with an upper surface of the upper molding layer.

2. The semiconductor package stack of claim 1, wherein, in a cross-section, the first heat spreading plate includes an upper part having a width different from a width of a lower part.

3. The semiconductor package stack of claim 1, wherein the second heat slug comprises:
a second heat spreading plate including a metal; and
a second thermal interface material between the second heat spreading plate and a lower surface of the second heat spreading plate.

4. The semiconductor package stack of claim 3, wherein the second thermal interface material contacts the upper semiconductor chip.

5. The semiconductor package stack of claim 1, wherein the opening comprises at least one of a polygonal shaped opening, a circularly shaped opening, a plurality of bar shaped openings, and a plurality of island shaped openings.

6. The semiconductor package stack of claim 1, further comprising:
a lower board pad disposed on an upper surface of the lower package board;
an upper board pad disposed on a lower surface of the upper package board; and
a connecting bump arranged between the lower board pad and the upper board pad that electrically connects the lower board pad and the upper board pad.

7. The semiconductor package stack of claim 6, wherein the lower semiconductor package further comprises a lower molding layer configured to substantially surround side surfaces of the lower semiconductor chip, expose the upper surface of the lower semiconductor chip, and substantially surround side surfaces of the connecting bump.

8. The semiconductor package stack of claim 1, wherein the lower semiconductor package further comprises:
a lower chip bump disposed between an upper surface of the lower package board and a lower surface of the lower semiconductor chip; and
an underfill configured to substantially surround the lower chip bump.

9. The semiconductor package stack of claim 1, wherein the upper semiconductor package further comprises a bonding wire configured to electrically connect a first upper board pad disposed on an upper surface of the upper package board to the upper semiconductor chip.

10. The semiconductor package stack of claim 1, wherein the upper semiconductor package further comprises an upper chip bump arranged between the upper semiconductor chip and the upper package board.

11. The semiconductor package stack of claim 10, wherein the upper semiconductor chip includes a through-silicon-via electrically connected to the upper chip bump and passing through the upper semiconductor chip.

12. The semiconductor package stack of claim 1, wherein:
the upper semiconductor package further comprises an upper chip bump arranged between the upper semiconductor chip and the first heat slug; and
the upper semiconductor chip includes a through-silicon-via connected to the upper chip bump and passing through the upper semiconductor chip.

13. A semiconductor package stack, comprising:
a lower semiconductor package including a lower semiconductor chip mounted on a lower package board, and a lower molding layer configured to cover an upper surface of the lower package board, substantially surround side surfaces of the lower semiconductor chip, and expose an upper surface of the lower semiconductor chip;
an upper semiconductor package including an upper semiconductor chip mounted on an upper package board, wherein the upper package board includes an opening exposing a lower surface of the upper semiconductor chip;
a connecting bump disposed between the upper surface of the lower package board and a lower surface of the upper package board, wherein side surfaces of the connecting bump are substantially surrounded by the lower molding layer;
a first heat slug arranged on the upper surface of the lower semiconductor chip, extending through the opening, and contacting the exposed lower surface of the upper semiconductor chip;
wherein the first heat slug comprises:
a first heat spreading plate including a metal;
a first lower thermal interface material between the first heat spreading plate and the upper surface of the lower semiconductor chip, the first lower thermal interface material being in direct contact with the upper surface of the lower semiconductor chip; and
a first upper thermal interface material between the first heat spreading plate, the first upper thermal interface material being in direct contact with the lower surface of the upper semiconductor chip.

14. A semiconductor package stack, comprising:
an upper semiconductor chip;
a lower semiconductor chip;
a package board including an opening; and
a first heat slug extending through the opening, substantially directly contacting a lower surface of the upper semiconductor chip, and substantially directly contacting an upper surface of the lower semiconductor chip;
a second heat slug disposed on the upper semiconductor chip; and
an upper molding layer configured to surround the upper semiconductor chip;
wherein:
the upper semiconductor chip is the uppermost semiconductor chip of the semiconductor package stack; and
the second heat slug is in contact with an upper surface of the upper molding layer.

15. The semiconductor package stack of claim 14, wherein the first heat slug comprises:
a heat spreading plate;
a lower thermal interface material arranged on a lower surface of the heat spreading plate and substantially directly contacting the upper surface of the lower semiconductor chip; and
an upper thermal interface material arranged on an upper surface of the first heat spreading plate and substantially directly contacting the lower surface of the upper semiconductor chip.

16. The semiconductor package stack of claim 14, wherein, in a cross-section, the opening includes an upper part having a width different from a width of a lower part.

17. The semiconductor package stack of claim 1, wherein the second heat slug extends to an outer edge of the upper semiconductor package.

18. The semiconductor package stack of claim 1, wherein the an upper molding layer is configured to cover the upper semiconductor chip.

19. The semiconductor package stack of claim 1, wherein the first lower thermal interface material and the first upper thermal interface material are electrically non-conductive materials.

20. The semiconductor package stack of claim 1, wherein the first lower thermal interface material and the first upper thermal interface material are not formed on the upper surface and a lower surface of the upper package board.

* * * * *